United States Patent [19]

Hanzawa

[11] Patent Number: 5,986,743
[45] Date of Patent: Nov. 16, 1999

[54] SCANNING EXPOSURE APPARATUS

[75] Inventor: Tatsuo Hanzawa, Chigasaki, Japan

[73] Assignee: Nikon Corporation, Tokyo, Japan

[21] Appl. No.: 08/839,822

[22] Filed: Apr. 18, 1997

[30] Foreign Application Priority Data

Apr. 19, 1996 [JP] Japan ................................ 8-122329

[51] Int. Cl.⁶ .......................... G03B 27/42; F16M 13/00
[52] U.S. Cl. .............................. 355/53; 355/72; 248/550; 248/638
[58] Field of Search .................................. 355/53, 72, 75; 73/662, 663; 356/375, 399, 400, 401; 248/638, 550, 566, 562, 563; 364/528.15

[56] References Cited

U.S. PATENT DOCUMENTS

| | | | |
|---|---|---|---|
| 5,172,160 | 12/1992 | Eijk et al. | 355/53 |
| 5,446,519 | 8/1995 | Makinouchi | 355/53 |
| 5,610,686 | 3/1997 | Osanai | 355/72 |
| 5,812,420 | 9/1998 | Takahashi | 355/53 |

FOREIGN PATENT DOCUMENTS

| | | |
|---|---|---|
| 6-163353 | 6/1994 | Japan . |
| 2299827 | 10/1996 | United Kingdom . |

*Primary Examiner*—Alan A. Mathews
*Attorney, Agent, or Firm*—Morgan, Lewis & Bockius LLP

[57] ABSTRACT

Provided is a reaction force isolator for an apparatus having a support installed on an installation surface and a movable body on the support, movement of the movable body generating a reaction force within the support. The reaction force isolator includes a movement sensor outputting a movement signal indicating movement of the movable body relative to the support; an actuator having a fixed portion connected to the installation surface and a movable portion connected to the support; and a control unit processing the movement signal to output an actuation signal to the actuator so that the actuator exerts a force on the support to offset the reaction force, the control unit providing an inhibit signal to disable the actuator when the movement signal indicates that the movable body is moving at a substantially constant velocity relative to the support.

17 Claims, 5 Drawing Sheets

SCANNING EXPOSURE APPARATUS

This application claims the benefit of Japanese Application No. 08-122329, filed on Apr. 19, 1996, which is hereby incorporated by reference.

BACKGROUND OF THE INVENTION

1. Field of the Invention

The present invention relates to an exposure apparatus and more particularly, a scanning exposure apparatus for transferring a pattern on a mask onto a photosensitive substrate during the manufacture of semiconductor devices, liquid crystal devices, or the like.

2. Discussion of the Related Art

Photolithography is one of the important processes in manufacturing semiconductor devices, liquid crystal display devices, or the like. In photolithography, a pattern on a mask is transferred onto a photosensitive substrate by exposure through a projection optical system, for example. In a projection exposure apparatus used in such a photolithography process, recent demand for exposing a larger chip pattern on the mask onto the photosensitive substrate has led to development of a scanning projection exposure apparatus in which the mask and the photosensitive substrate are synchronously moved and scanned by a spatially fixed exposing radiation. In general, the exposing radiation has a slit-like or circular illumination field. The mask and the photosensitive substrate are mounted on a mask and a substrate stage, respectively, and the mask stage and substrate stage are moved in predetermined directions.

The scanning exposure operation generates undesirable reaction forces within the exposure apparatus, and as a result, various components of the exposure apparatus may be inclined or deformed. The reaction forces are normally generated during acceleration and deceleration periods of the mask and substrate movement, but not during constant motion of the mask and substrate stages. To solve this problem, a method of generating counter forces has been proposed. In this method, suitable driving signals are amplified and supplied to actuators, which exert appropriate forces to the apparatus to cancel the reaction forces. FIG. 6 plots the driving signal level versus time during scanning exposure operation. The graph shows that driving signal S1 has positive and negative peaks at an acceleration period Ap and a deceleration period Dp, respectively.

In the conventional method above, however, a driving signal S1 of small magnitude is supplied to the actuators through the amplifiers even during a constant-motion period Cp (FIG. 6). This is because the amplifiers connected to the actuators are always held in the ON-state. Thus, even when the thrust command signal (driving signal) S1 should not be generated (during a constant-speed operation), there is a possibility of generating the thrust command signal S1 due to noise in the amplifiers, or due to fluctuation in velocity during the constant-speed motion of the stages. As a result, unnecessary forces may be generated within the apparatus, in particular, in support members that supports the mask stage and the substrate stage. These forces may degrade scanning accuracy (or alignment accuracy between the mask and the substrate).

SUMMARY OF THE INVENTION

Accordingly, the present invention is directed to a scanning exposure apparatus that substantially obviates the problem due to limitations and disadvantages of the related art.

An object of the present invention is to improve alignment accuracy in scanning the mask and the substrate in a scanning exposure apparatus.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a reaction force isolator for an apparatus having a support installed on an installation surface and a movable body on the support, movement of the movable body generating a reaction force within the support, the reaction force isolator including a movement sensor outputting a movement signal indicating movement of the movable body relative to the support; an actuator having a fixed portion connected to the installation surface and a movable portion connected to the support; and a control unit processing the movement signal to output an actuation signal to the actuator so that the actuator exerts a force on the support to offset the reaction force, the control unit providing an inhibit signal to disable the actuator when the movement signal indicates that the movable body is moving at a substantially constant velocity relative to the support.

In another aspect, the present invention provides a scanning exposure apparatus for installation on an installation surface, the scanning exposure apparatus including a support column to be supported by the installation surface; a mask stage movably installed in the support column; a wafer stage movably installed in the support column; a mask movement sensor outputting a mask movement signal indicating movement of the mask relative to the support column; a wafer movement sensor outputting a wafer movement signal indicating movement of the wafer relative to the support column; a first actuator having a fixed portion connected to the installation surface and a movable portion connected to the support column adjacent the wafer stage; a second actuator having a fixed portion connected to the installation surface and a movable portion connected to the support column adjacent the mask stage; and a control unit outputting a mask stage driving signal to the mask stage and a wafer stage driving signal to the wafer stage to move the mask stage and the wafer stage, the control unit processing the wafer movement signal to output a first actuation signal to the first actuator so that the first actuator exerts a first force on the support column, and the control unit processing the mask movement signal to output a second actuation signal to the second actuator so that the second actuator exerts a second force on the support column, the control unit terminating the first actuation signal to disable the first actuator when the wafer movement signal indicates that the wafer stage is moving at a substantially constant velocity and terminating the second actuation signal to disable the second actuator when the mask movement signal indicates that the mask stage is moving at a substantially constant velocity relative to the support column.

In another aspect, the present invention provides an apparatus for installation on an installation surface including a support to be installed on the installation surface; a body movably installed in the support, the body moving in one of three movement modes of a constant velocity mode, an acceleration mode, and a deceleration mode, wherein the body moves relative to the support at a substantially constant velocity in the constant velocity mode, and wherein when the body moves in the acceleration mode and the deceleration mode, corresponding reaction forces are generated in the support; a movement sensor outputting a mode signal indicating the movement mode of the body; a stable member fixed on the installation surface adjacent to the support; an actuator having a fixed portion fixed to the stable member and a movable portion connected to the support adjacent the body; and a control unit processing the mode signal corresponding to one of the acceleration mode and the deceleration mode to output an actuation signal to the actuator so that the actuator exerts a counter force on the support to offset the corresponding reaction force, the control unit terminating the actuation signal to disable the actuator when receiving the mode signal corresponding to the constant velocity mode.

In another aspect, the present invention provides a method for isolating a reaction force generated within a support in response to movement of a movable body on the support, the method including the steps of moving the movable body relative to the support, movement of the movable body generating the reaction force in the support; outputting a movement signal indicating the movement of the movable body; processing the movement signal to output a driving signal; exerting a force on the support in accordance with the driving signal to offset the reaction force; and terminating the driving signal when the movement signal indicates that the movable body is moving at a substantially constant velocity.

In a further aspect, the present invention provides a scanning exposure apparatus wherein a mask and a photosensitive substrate are moved in synchronization with each other so that a pattern on the mask is transferred onto the photosensitive substrate, the scanning exposure apparatus including a mask stage holding the mask; a substrate stage holding the photosensitive substrate; driving units for moving the mask stage and the substrate stage in synchronization with each other; a support member that supports the mask stage and the substrate stage; a vibration damper for applying force to the support member, thereby to suppress vibration that occurs in the support member; and vibration damping controller for operating the vibration damper while the mask stage and the substrate stage are being moved in one of an accelerating mode and a decelerating mode, and stopping the vibration damper operation while the mask stage and the substrate stage are being moved at a constant speed.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

A preferred embodiment of the present invention will be described below. In this embodiment, the present invention is applied to a slit-scan type projection exposure apparatus.

Figure 1:
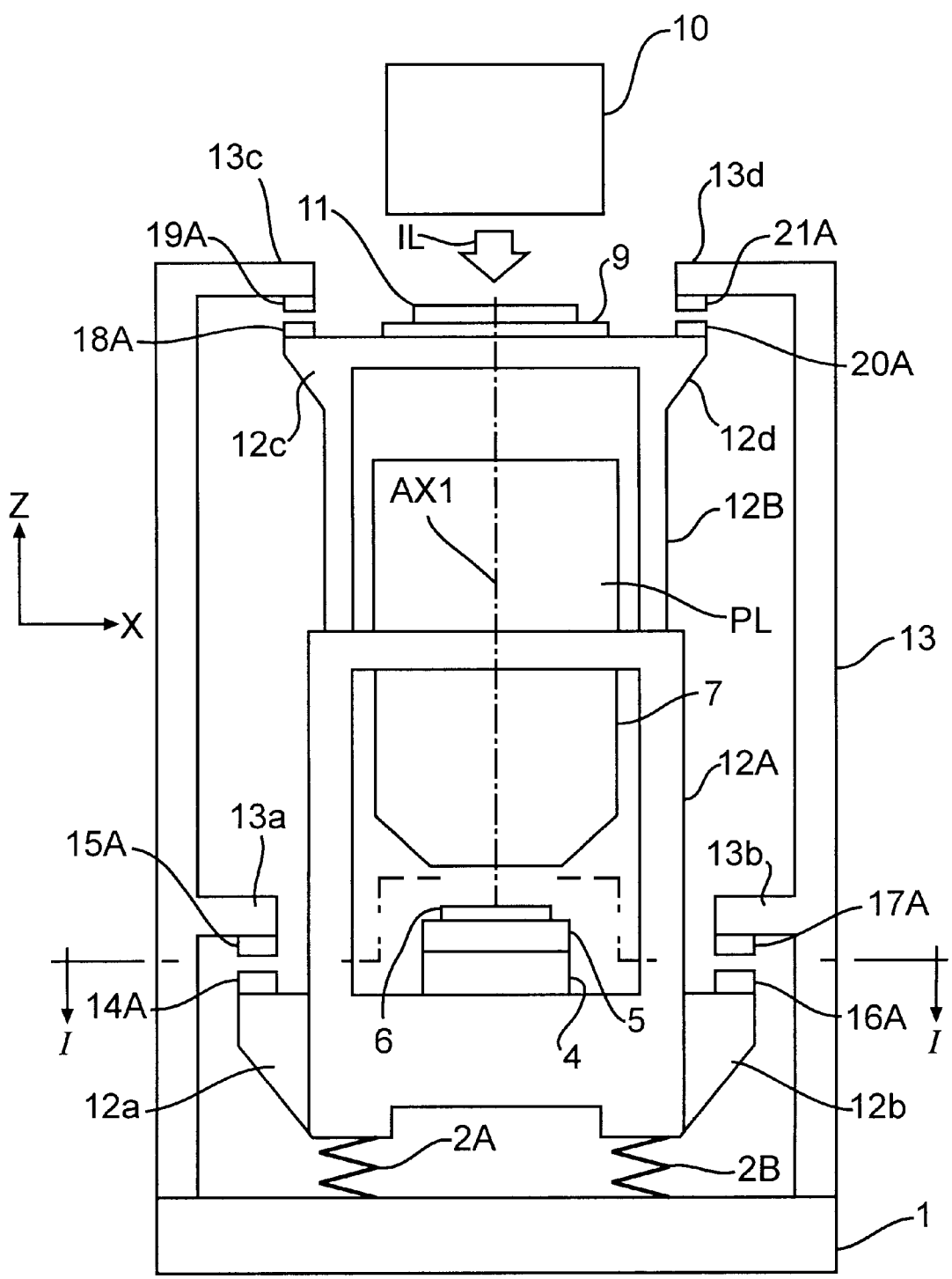
FIG. 1 is a schematic view showing the construction of a scanning projection exposure apparatus according to a preferred embodiment of the present invention.
Figure 2:
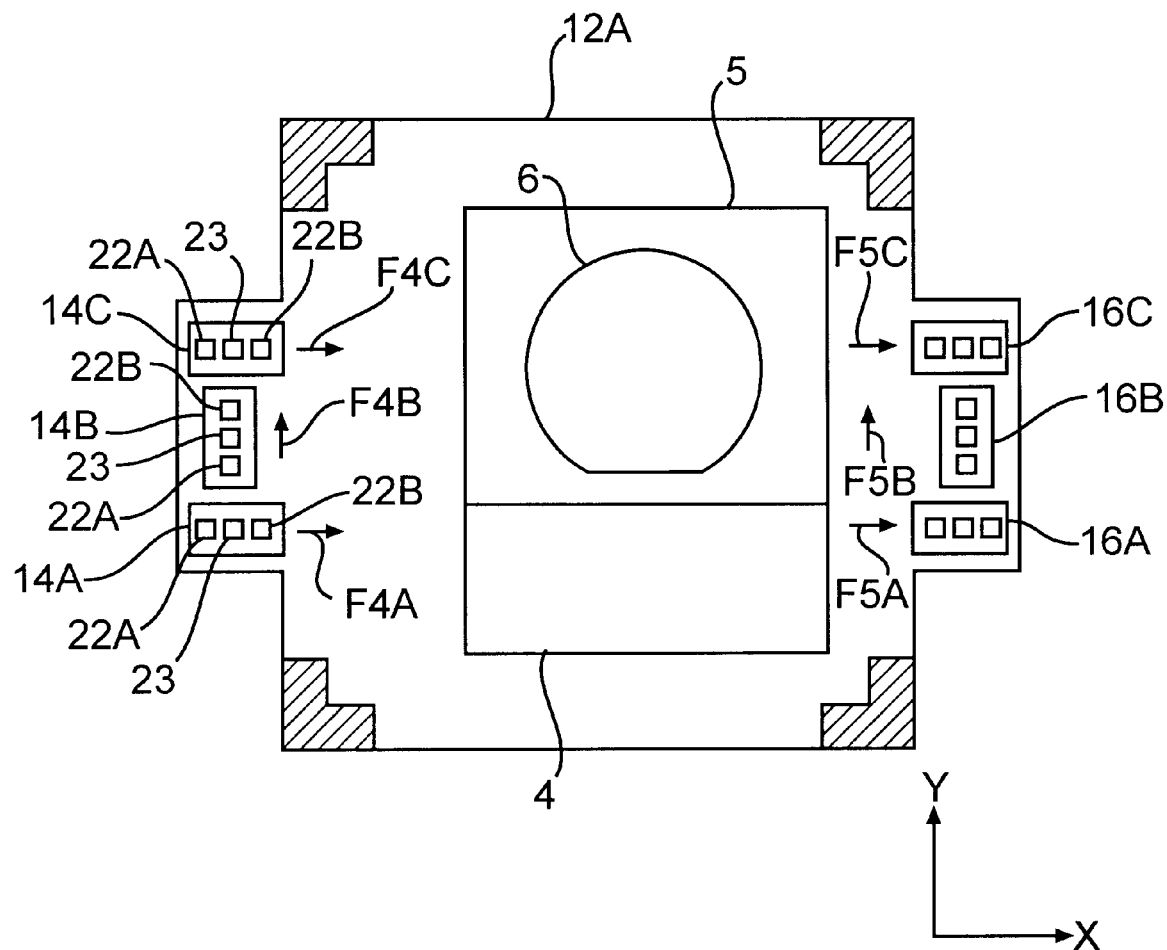
FIG. 2 is a cross-sectional view taken along line I—I of FIG. 1.
Figure 3:
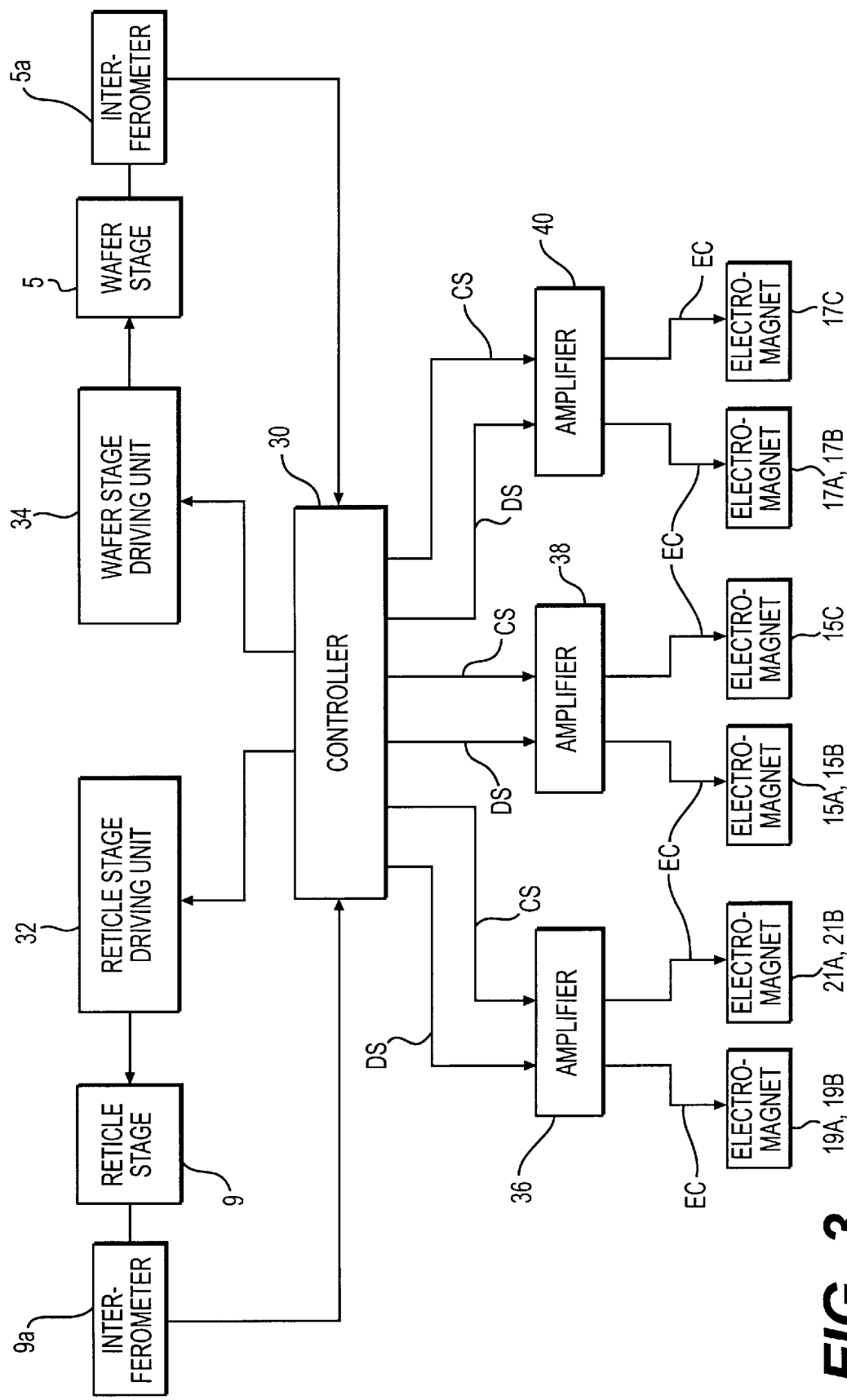
FIG. 3 is a block diagram showing a control system for controlling actuators of the preferred embodiment of the present invention.

Referring to FIGS. 1, 2, and 3, a projection exposure apparatus of the present embodiment will be described in detail. FIG. 1 schematically shows the construction of the projection exposure apparatus of the present embodiment. A first column 12A formed of rigid material such as Invar (an alloy having a low thermal expansion coefficient) is mounted on a base plate 1 through damping springs 2A and 2B (vibration dampers). Second column 12B, which is also formed of rigid material such as Invar, is mounted on the first column 12A. Wafer 6 (substrate) is held or supported in the inside of the first column 12A through a Y stage 4 and an X stage 5. Projection optical system PL is supported by the upper portion of the first column 12A through a lens-barrel 7. Reticle 11 (mask) is held on a reticle stage 9 (mask stage) at the top of the second column 12B. A slit-like light beam emitted from an illumination optical system 10 illuminates the reticle 11 to define an illumination area and exposes the wafer 6 through the projection optical system PL. The reticle 11 is movable in the positive and negative X-directions with respect to the illumination area, and the wafer 6 is also movable in the positive and negative X-directions in synchronization with the reticle 11. For example, when the reticle is moved in the positive X-direction, the wafer 6 is moved in the negative X-direction and a pattern on the reticle 11 is successively imaged onto the wafer 6 by scanning exposure.

Stable column 13 made of rigid material such as Invar is mounted on the peripheral portions of the base plate 1. Three permanent magnets 14A, 14B, and 14C (only 14A is shown in FIG. 1) are installed on the upper face of a protruding portion 12a of the first column 12A on the negative X-direction side. Three electromagnets 15A, 15B and 15C (only 15A is shown in FIG. 1) are installed on the bottom face of a protruding portion 13a of the stable column 13, and are engaged with the permanent magnets 14A, 14B, and 14C, respectively. Thus, the permanent magnets 14A–14C and the corresponding electromagnets 15A–15C constitute three linear motors (actuators). Similarly, three permanent magnets 16A, 16B, and 16C (only 16A is shown in FIG. 1) are installed on the upper face of a protruding portion 12b of the first column 12A on the +X-direction side. Three electromagnet 17A, 17B, and 17C (17A is shown in FIG. 1) are formed on the bottom face of a protruding portion 13b of the stable column 13, and are engaged with the permanent magnets 16A–16C, respectively. Thus, the permanent magnets 16A–16C and the corresponding electromagnets 17A–17C constitute three linear motors.

In addition, two permanent magnets 18A, 18B (only 18A is shown in FIG. 1) are installed on the upper face of a protruding portion 12c formed on the negative X-direction side of the upper portion of the second column 12B. Two electromagnets 19A, 19B (only 19A is shown in FIG. 1) are installed on the bottom face of a protruding portion 13c formed at the upper end of the stable column 13, and are engaged permanent magnets 18A, 18B, respectively. Similarly, two permanent magnets 20A, 20B (only 20A is shown in FIG. 1) are installed on the upper face of a protruding portion 12d formed on the positive X-direction side of the upper portion of the second column 12B. Two electromagnets 21A, 21B (only 21A is shown in FIG. 1) are installed at the bottom face of a protruding portion 13d formed on the upper end of the stable column 13, and are engaged with the permanent magnets 20A, 20B.

FIG. 2 is a cross-sectional view, taken along line I—I in FIG. 1. As shown in FIG. 2, the three permanent magnets 14A–14C are disposed in the Y-direction on the left side of the first column 12A. In the permanent magnets 14A and 14C, north-pole portion 22A, south-pole portion 23, and north-pole portion 22B of permanent magnets are embedded in this order along the X-direction. In the middle permanent magnet 14B, north-pole portion 22A, south-pole portion 23 and north-pole portion 22B are embedded in this order along the Y-direction. The electromagnets 15A and 15C (not shown) each includes a plurality of electromagnets disposed in the X-direction, and the electromagnet 15B includes a plurality of electromagnets disposed in the Y-direction.

In this arrangement, a first linear motor is constructed of the permanent magnetic 14A and the corresponding electromagnet 15A. A second linear motor is constructed of the permanent magnet 14C and the corresponding electromagnet 15C. The first and second linear motors are capable of exerting forces F4A and F4C, respectively, on the first column 12A in the X-direction. Also, a third linear motor is constructed of the permanent magnet 14B and the corresponding electromagnet 15B, and is capable of exerting a force F4B on the first column 12A in the Y-direction.

On the other side (right hand side), magnetic poles are arranged in the permanent magnets 16A–16C in the same manner as the permanent magnets 14A–14C. In each of the electromagnets 17A–17C corresponding to the permanent magnets 16A–16C, a plurality of electromagnets are disposed in the same direction as the magnetic poles in the corresponding electromagnet. As in the left side, the linear motor consisting of the permanent magnet 16A and the corresponding electromagnet 17A is capable of exerting a force F5A on the first column 12A in the X-direction. The linear motor consisting of the permanent magnet 16C and the corresponding electromagnet 17C is capable of exerting a force F5C on the first column 12A in the X-direction. Also, the linear motor consisting of the permanent magnet 16B and the corresponding electromagnet 17B is capable of exerting a force F5B on the first column 12A in the Y-direction.

The three linear motors provided on each of the left- and right-hand sides of the first column 12A can exert a force in an arbitrary direction to the first column 12A in a horizontal plane (XY plane), and can also exert a rotating force on the first column 12A. When reaction forces are generated to the first column 12A in response to forces due to acceleration of the X stage 5 and Y stage 4 during scanning exposure operations, the six linear motors above serve to exert appropriate forces (counter forces) to the first column 12A to offset the reaction forces.

The two permanent magnets 18A and 18B on the left side of the second column 12B each have a plurality of magnetic poles arranged in the X-direction, and the corresponding electromagnets 19A and 19B each have a plurality of electromagnets arranged in the X-direction. Similarly, the permanent magnets 20A and 20B on the right side of the second column 12B each have a plurality of magnetic poles arranged in the X-direction, and the corresponding electromagnets 21A and 21B each have a plurality of electromagnets arranged in the X-direction. Thus, two linear motors corresponding to the permanent magnets 18A and 18B exert forces to the second column 12B in the X-direction. Similarly, two linear motors corresponding to the permanent magnets 20A and 20B exert a force on the second column 12B in the X-direction.

In the present embodiment, since the reticle 11 is moved only in the positive and negative X-directions by the reticle stage 9, the direction of the reaction force being generated on the second column 12B is the positive or negative X-direction. Thus, to cancel the reaction force, the linear motors need to exert a force on the second column 12B only in the +X-direction. If the reticle 11 is also moved in the Y-direction, however, additional linear motors need be installed to exert forces in the Y-direction, preferably two or more being separated with each other by a predetermined distance.

FIG. 3 shows a block diagram for controlling the actuators (linear motors) of the present embodiment. In this figure, a controller 30 controls movements of the reticle stage 9, wafer X stage 5, and the Y stage 4, through a reticle stage driving unit 32 and a wafer stage driving unit 34. The controller 30 also monitors movements of the reticle stage 9 and wafer X stage 5 by receiving output signals from an interferometer 9a that measures the position of the reticle stage 9 and from an interferometer Sa that measures the position of the wafer X stage 5. The controller 30 includes either hardware or software for processing the outputs of the interferometers 9a and 5a and determining movement, for example, acceleration, velocity, and the like. This way, the controller 30 can detect whether the reticle stage 9 and the wafer X stage 5 are moved in an acceleration mode, constant-velocity mode, or deceleration mode in accordance with the signals received from the interferometers 9a and 5a. The controller 30 further determines if the measurement value is substantially constant to indicate constant velocity. At the time that constant velocity is detected, the hardware or software within controller 30 generates a control signal CS having a predetermined value (inhibit signal) to inhibit output by the amplifiers 36, 38, and 40.

The controller 30 supplies driving signals DS (amplifier-driving signal) to amplifiers 36, 38, 40, which supply driving current to the electromagnets (19A, 19B, 21A, 21B, 15A, 15B, 15C, 17A, 17B, 17C) for generating thrust (force). In addition, the controller 30 supplies the control signals CS (enable signal or disable signal) to the amplifiers 36, 38, 40 to control the outputs of the amplifiers 36, 38, 40. When the reticle stage 9 and wafer X stage 5 are moved in the acceleration or decelerating mode during scan exposure, the controller 30 supplies an enable signal to each of the amplifiers 36, 38, 40. When the reticle stage 9 and wafer X stage 5 are in the state other than the acceleration and deceleration modes above, i.e., moving at a constant velocity, controller 30 supplies a disable signal (inhibit signal) to each of the amplifiers 36, 38, 40.

The enable signal allows the amplifiers 36, 38, 40 to generate signals. If the enable signals are supplied to the amplifiers 36, 38, 40, these amplifiers supply to the corresponding electromagnets driving currents EC (actuation signal) in accordance with the drive signal DS from the controller 30. On the other hand, the disable signal inhibits the amplifiers 36, 38, 40 from generating signals, terminating the driving currents EC. If the disable signals are supplied to the amplifiers 36, 38, 40, each of the amplifiers stops sending any driving current EC to the corresponding electromagnets. Thus, when the reticle stage 9 and wafer X stage 5 are moved in the acceleration or deceleration mode, appropriate thrusts are given to the first and second base columns 12A, 12B to offset the reaction forces. When the reticle stage 9 and X stage 5 are in the state other than the acceleration and deceleration modes, i.e., moving at a constant velocity, no thrust (force) is given to the first and second columns 12A, 12B.

Figure 4:
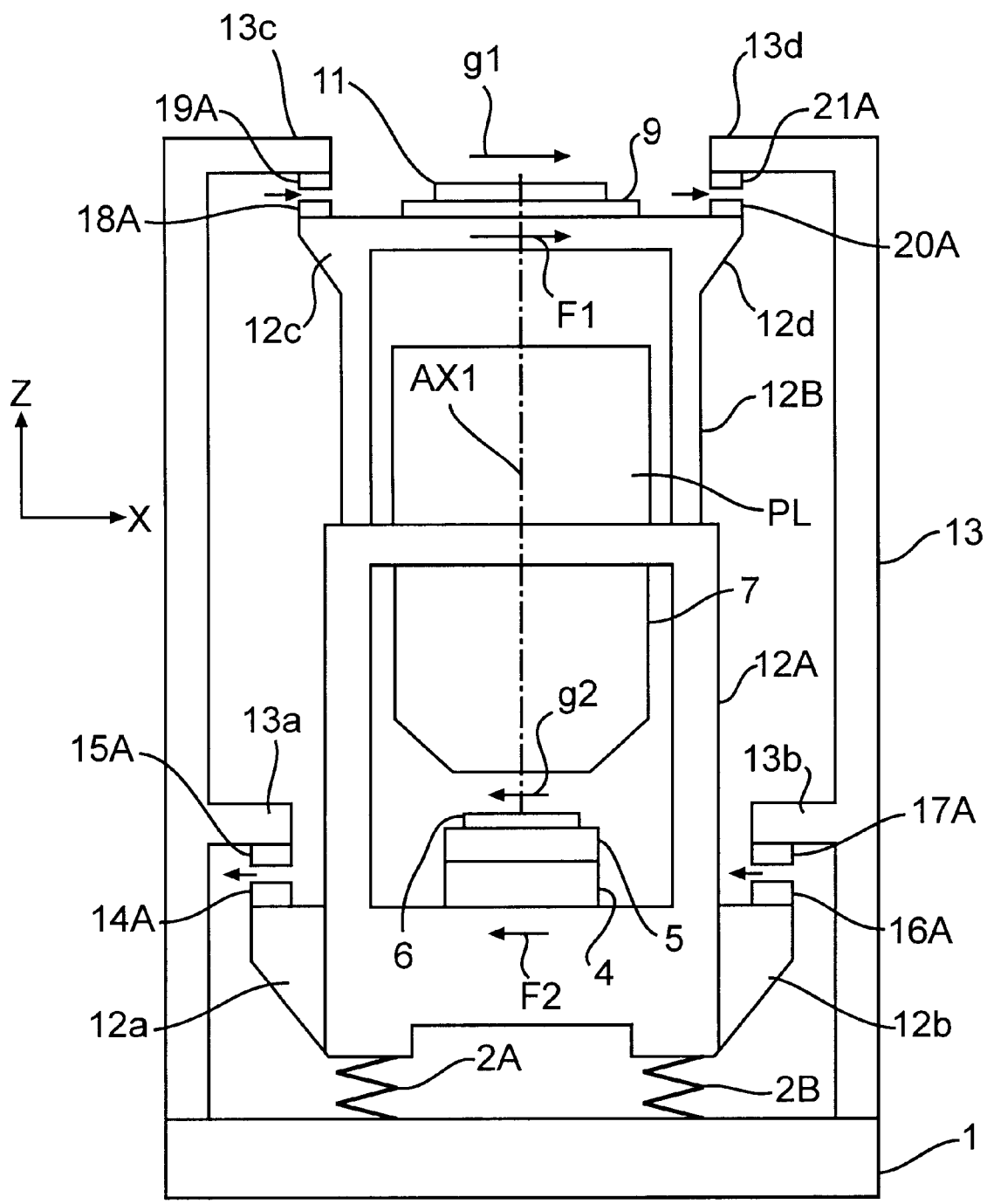
FIG. 4 is a schematic view showing the operation of the preferred embodiment.
Figure 5:
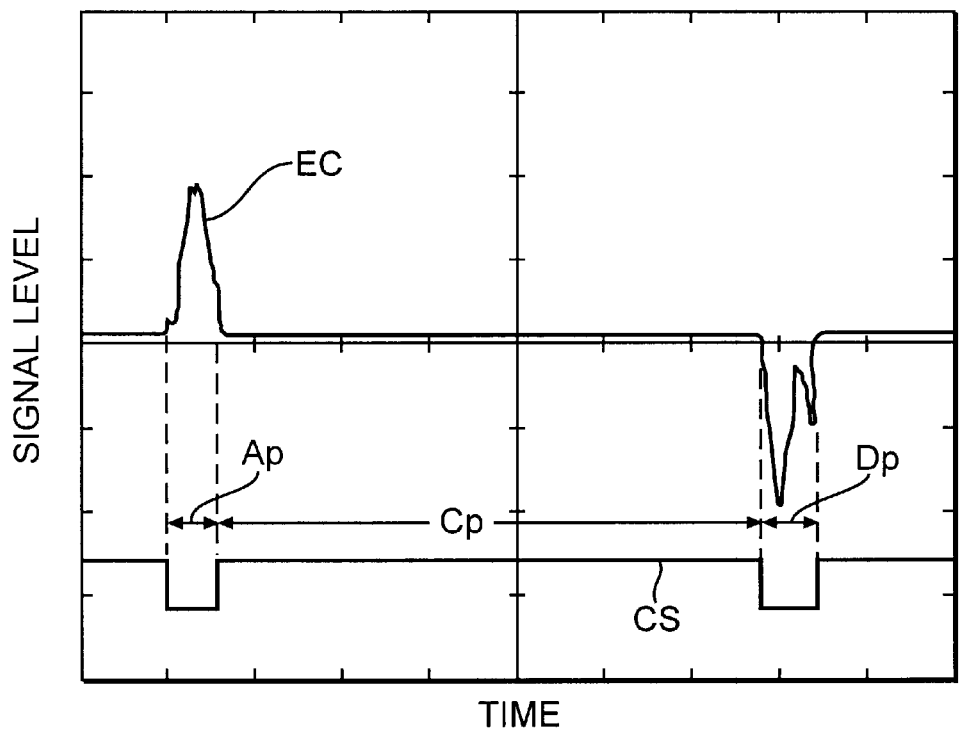
FIG. 5 is a graph showing a driving signal level and a control signal versus time according to the preferred embodiment.
Figure 6:
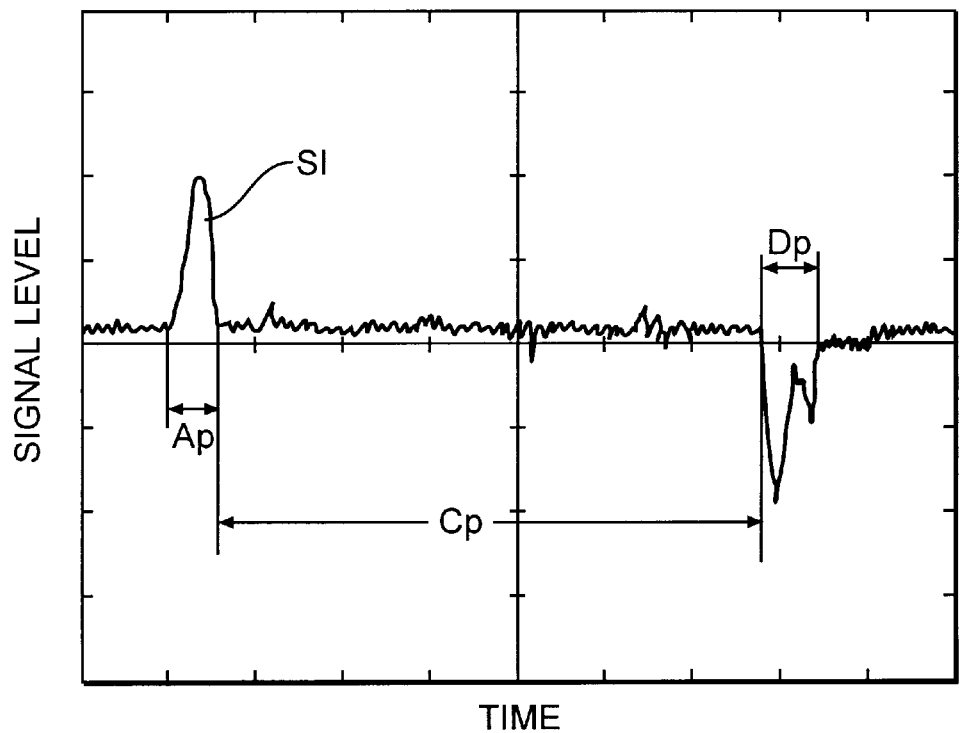
FIG. 6 is a graph showing a driving signal level versus time in the conventional exposure apparatus.

Operation of the present embodiment will be described with reference to FIGS. 4 and 5. First, FIG. 5 shows the driving current EC (output signal of either one of the amplifiers 36, 38, 40), and the control signal CS (enable or disable signal) supplied to the amplifiers 36, 38, 40 from the controller 30. When the reticle stage 9 and wafer X stage 5 are driven in synchronization with each other to perform scanning exposure (or slit-scan exposure using a slit-like illumination area) during an accelerating period Ap, an accelerating force g1 is applied to the reticle 11 in the positive X-direction and an accelerating force g2 is applied to the wafer 6 in the negative X-direction (FIG. 4). In this period, the controller 30 supplies the drive signals DS and enable signals (LOW signal) as control signal CS to the amplifiers 36, 38, 40. The amplifiers 36, 38, 40, which have received the enable signals, are allowed to generate signals, and thus supply to the corresponding electromagnets (19A, 19B, 21A, 21B, 15A, 15B, 15C, 17A, 17B, 17C) the driving currents EC in accordance with the driving signals DS from the controller 30. With the driving current EC thus supplied from the amplifiers 36, 38, 40 to these electromagnets of the linear motors, forces are generated between the electromagnets and the corresponding permanent magnets, and accordingly, a force F1 is exerted on the second column 12B in the positive X-direction and a force F2 is exerted on the first column 12A in the negative X-direction.

When the reticle stage 9 and wafer X stage 5 reach a constant-speed period Cp after the acceleration period Ap (FIG. 5), the reaction forces to the reticle 11 and wafer 6 are substantially reduced or eliminated. In this period Cp, the controller 30 supplies disable signals (HIGH signals in the figure) as control signals CS to the amplifiers 36, 38, 40. The amplifiers 36, 38, 40, which have received the disable signals, are incapable of generating signals. As a result, no driving current EC is generated from the amplifiers 36, 38, 40 even if weak driving signals DS are received from the controller 30. Since no driving current EC is supplied to the electromagnets from the amplifiers 36, 38, 40, virtually no force is generated between the electromagnets and the corresponding permanent magnets.

When the reticle stage 9 and wafer X stage 5 reaches a deceleration period DP after the constant-speed period Cp, an acceleration force opposite to the force g1 is generated to the reticle 11 and an acceleration force opposite to the force g2 is generated to the wafer 6. In this deceleration period, the control portion 30 supplies enable signals (LOW signals) as control signals CS and the drive signals DS to the amplifiers 36, 38, 40. The amplifiers 36, 38, 40, which have received the enable signals, are allowed to generate signals, and thus supply to the corresponding electromagnets (19A, 19B, 21A, 21B, 15A, 15B, 15C, 17A, 17B, 17C) the driving currents EC in accordance with the driving signals DS from the control portion 30. With the driving current EC supplied from the amplifiers 36, 38, 40 to these electromagnets, forces are generated between the respective electromagnets and the corresponding permanent magnets. As a result, a negative X directive force opposite to the force F1 is exerted on the second column 12B and a positive X direction force opposite to the force F2 is exerted on the first column 12A.

With the operations above, the reaction forces generated in the first column 12A and second column 12B are eliminated by the counter forces F2 and F1 during the acceleration period Ap and deceleration period Dp of the reticle stage 9 and wafer X stage 5. Therefore, high alignment accuracy between the image of the reticle 11 and the wafer 6 can be achieved without causing inclination or deformation of the first column 12A and the second column 12B.

Since virtually no forces are applied to the first column 12A and second column 12B in the constant-speed period CS during the scanning operation, the first column 12A and second column 12B do not receive unnecessary forces, which would be generated due to noise in electric circuits including the amplifiers 36, 38, 40 or due to small fluctuation in the speed of the stages during the constant-speed driving operation. Accordingly, the scanning exposure operation of the reticle 11 and wafer 6 is accomplished with improved operating accuracy.

In more general terms, in the scanning exposure apparatus of the invention as described above, the operation of the linear motors for applying force to the support member is terminated when the mask stage and substrate stage are moved at a constant speed for relative scanning of the mask and photosensitive substrate, so that the output of a thrust command signal (actuation signal) is interrupted or prevented during a period when the thrust command signal should not be generated. Thus, the support member that holds the mask stage and the substrate stage do not receive unnecessary forces, which would be generated due to noise in electric circuits including amplifiers, due to fluctuation in velocity during constant-velocity driving of these stages in exposure operation, or due to some other causes. Consequently, the mask and the substrate are synchronously scanned by exposing radiation with improved operation accuracy.

It will be apparent to those skilled in the art that various modifications and variations can be made in the scanning exposure apparatus of the present invention without departing from the spirit or scope of the invention. Thus, it is intended that the present invention cover the modifications and variations of this invention provided they come within the scope of the appended claims and their equivalents. For instance, the mechanism used for exerting forces to the first and second columns 12A, 12B is not limited to the linear motor mechanism described above, but such mechanisms that utilize compressed air or compressed coil springs may be used for that purpose.

What is claimed is:

1. A reaction force isolator for an apparatus having a support installed on an installation surface and a movable body on the support, movement of the movable body generating a reaction force within the support, the reaction force isolator comprising:

a movement sensor outputting a movement signal indicating movement of the movable body relative to the support;

an actuator having a fixed portion connected to the installation surface and a movable portion connected to the support; and a control unit processing the movement signal to output an actuation signal to the actuator so that the actuator exerts a force on the support to offset the reaction force, the control unit providing an inhibit signal to the actuator to forcefully disable the actuator when the movement signal indicates that the movable body is moving at a substantially constant velocity relative to the support, wherein the control unit includes a controller processing the movement signal to output an amplifier-driving signal, the control unit further including an amplifier processing the amplifier-driving signal to output the actuation signal to the actuator, the inhibit signal from the controller inhibiting any output signal from the amplifier for the duration of the inhibit signal.

2. The reaction force isolator according to claim 1, further comprising a vibration damper between the installation surface and the support.

3. A scanning exposure apparatus for installation on an installation surface, comprising:

a support column to be supported by the installation surface;

a mask stage movably installed in the support column;

a wafer stage movably installed in the support column;

a mask movement sensor outputting a mask movement signal indicating movement of the mask relative to the support column;

a wafer movement sensor outputting a wafer movement signal indicating movement of the wafer relative to the support column;

a first actuator having a fixed portion connected to the installation surface and a movable portion connected to the support column adjacent the wafer stage;

a second actuator having a fixed portion connected to the installation surface and a movable portion connected to the support column adjacent the mask stage; and a control unit outputting a mask stage driving signal to the mask stage and a wafer stage driving signal to the wafer stage to move the mask stage and the wafer stage, the control unit processing the wafer movement signal to output a first actuation signal to the first actuator so that the first actuator exerts a first force on the support column, and the control unit processing the mask movement signal to output a second actuation signal to the second actuator so that the second actuator exerts a second force on the support column, the control unit terminating the first actuation signal to disable the first actuator when the wafer movement signal indicates that the wafer stage is moving at a substantially constant velocity and terminating the second actuation signal to disable the second actuator when the mask movement signal indicates that the mask stage is moving at a substantially constant velocity relative to the support column.

4. The scanning exposure apparatus according to claim 3, wherein movement of the wafer stage generates a first reaction force in the support column adjacent the wafer stage, wherein movement of the mask stage generates a second reaction force in the support column adjacent the mask stage, the first actuator exerting the first force on the support column to offset the first reaction force, and the second actuator exerting the second force on the support column to offset the second reaction force.

5. The scanning exposure apparatus according to claim 4, wherein the support column includes a first column and a second column on the first column, the first column mounting the wafer stage and the second column mounting the mask stage, wherein movement of the wafer stage generates the first reaction force in the first column, and movement of the mask stage generates the second reaction force in the second column, and wherein the movable portion of the first actuator is connected to the first column, and the movable portion of the second actuator is connected to the second column.

6. The scanning exposure apparatus according to claim 3, wherein the control unit includes:

a controller processing the wafer movement signal to output a first amplifier-driving signal and processing the mask movement signal to output a second amplifier-driving signal;

a first amplifier processing the first amplifier-driving signal to output the first actuation signal to the first actuator; and a second amplifier processing the second amplifier-driving signal to output the second actuation signal to the second actuator, and wherein when the wafer movement signal indicates that the wafer stage is moving at a substantially constant velocity, the controller outputs a disable signal to the first amplifier to terminate the first actuation signal, and when the mask movement signal indicates that the mask stage is moving at a substantially constant velocity, the controller outputs a disable signal to the second amplifier to terminate the second actuation signal.

7. The scanning exposure apparatus according to claim 3, further comprising a vibration damper between the installation surface and the support column.

8. The scanning exposure apparatus according to claim 3, wherein the wafer movement sensor includes a first interferometer, and the mask movement sensor includes a second interferometer.

9. The scanning exposure apparatus according to claim 3, wherein the support column includes a first column mounting the wafer stage and a second column mounting the mask stage, wherein the movable portion of the first actuator is connected to the first column, and the movable portion of the second actuator is connected to the second column.

10. The scanning exposure apparatus according to claim 3, wherein the first actuator includes a first linear motor and the second actuator includes a second linear motor.

11. The scanning exposure apparatus according to claim 3, wherein the wafer stage moves in a first predetermined direction parallel to the installation surface, and the mask stage moves in a second predetermined direction parallel to the installation surface.

12. The scanning exposure apparatus according to claim 11, wherein the movable portion of the first actuator is movable in the first predetermined direction, and the movable portion of the second actuator is movable in the second predetermined direction.

13. The scanning exposure apparatus according to claim 12, wherein the first direction is opposite to the second direction.

14. The scanning exposure apparatus according to claim 3, further comprising a stable support fixed on the installation surface, wherein the fixed portions of the first and second actuators are fixed to the stable support.

15. An apparatus for installation on an installation surface, comprising:

a support to be installed on the installation surface;

a body movably installed in the support, the body moving in one of three movement modes of a constant velocity mode, an acceleration mode, and a deceleration mode, wherein the body moves relative to the support at a substantially constant velocity in the constant velocity mode, and wherein when the body moves in the acceleration mode and the deceleration mode, corresponding reaction forces are generated in the support;

a movement sensor outputting a mode signal indicating the movement mode of the body;

a stable member fixed on the installation surface adjacent to the support;

an actuator having a fixed portion fixed to the stable member and a movable portion connected to the support adjacent the body; and a control unit processing the mode signal corresponding to one of the acceleration mode and the deceleration mode to output an actuation signal to the actuator so that the actuator exerts a counter force on the support to offset the corresponding reaction force, the control unit terminating the actuation signal to forcefully disable the actuator when receiving the mode signal corresponding to the constant velocity mode, wherein the control unit includes a controller processing the mode signal corresponding to one of the acceleration mode and the deceleration mode to output an amplifier-driving signal, the controller processing the mode signal corresponding to the constant velocity mode to output a disable signal, the control unit further including an amplifier processing the amplifier-driving signal to output the actuation signal to the actuator, the amplifier processing the disable signal to terminate the actuation signal.

16. The reaction force isolator according to claim 15, further comprising a vibration damper between the installation surface and the support.

17. A method for isolating a reaction force generated within a support in response to movement of a movable body on the support, the method comprising the steps of:

moving the movable body relative to the support, movement of the movable body generating the reaction force in the support;

outputting a movement signal indicating the movement of the movable body;

processing the movement signal to output a driving signal, including the steps of processing the movement signal to output an amplifier signal and processing the amplifier signal to output the driving signal;

exerting a force on the support in accordance with the driving signal to offset the reaction force; and forcefully terminating the driving signal when the movement signal indicates that the movable body is moving at a substantially constant velocity, including the steps of outputting a disable signal when the movement signal indicates that the movable body is moving at a substantially constant velocity and terminating the driving signal in accordance with the disable signal.

* * * * *